United States Patent
Choe

(10) Patent No.: US 8,525,164 B2
(45) Date of Patent: Sep. 3, 2013

(54) SEMICONDUCTOR DEVICE AND METHOD FOR FABRICATING THE SAME

(75) Inventor: Ki-Beom Choe, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/606,718

(22) Filed: Sep. 7, 2012

(65) Prior Publication Data

US 2013/0045566 A1 Feb. 21, 2013

Related U.S. Application Data

(62) Division of application No. 12/825,410, filed on Jun. 29, 2010, now Pat. No. 8,283,658.

(30) Foreign Application Priority Data

Jul. 3, 2009 (KR) .......................... 10-2009-0060560

(51) Int. Cl.
*H01L 51/10* (2006.01)

(52) U.S. Cl.
USPC .............................................. 257/40

(58) Field of Classification Search
USPC ............ 257/288, 57, 401, 901, 40, E29.255, 257/E51.006, 66, 72, 223, 227, 291, 292, 257/439,443, 655, E27.1, E21.7, E27.125, 257/E27.112, E29.117, E29.182, E29.202, 257/E29.273– E29.299, E29.314, E29.32, 257/E23.016, E29.003, 151–153, 249, 314–320, 257/331, 366, 387, 412, E29.125–E29.131, 257/E29.134–E29.138, E29.14– E29.161, 257/E21.374, E21.458, E21.624–E21.624, 257/E21.635–E21.638, E29.049–E29.067, 257/E29.237, E29.256–E29.26, E21.086, 257/E21.097–E21.1,E21.108–E21.113, E21.117– 257/E21.118, 257/E21.542, E21.697–E21.699; 438/292–308 , 149, 163, 285, 603–604, 606 438/ 930–933, 188, 189, 37, 41, 44, 46, 438/47, 84–87, 93–95, 102–105, 478–509, 438/607, 647

See application file for complete search history.

(56) References Cited

U.S. PATENT DOCUMENTS

| 2006/0027860 A1* | 2/2006 | Nomoto ......................... 257/327 |
| 2009/0026552 A1* | 1/2009 | Zhang et al. .................. 257/401 |
| 2009/0191682 A1* | 7/2009 | Kamada ......................... 438/290 |

* cited by examiner

*Primary Examiner* — Dao H Nguyen
*Assistant Examiner* — Tram H Nguyen
(74) *Attorney, Agent, or Firm* — IP & T Group LLP

(57) ABSTRACT

A semiconductor device includes a conductive layer formed in the junction region and a boundary layer arranged to wrap a side and a bottom of the conductive layer.

10 Claims, 5 Drawing Sheets

SEMICONDUCTOR DEVICE AND METHOD FOR FABRICATING THE SAME

CROSS-REFERENCE TO RELATED APPLICATIONS

The present application is a division of U.S. patent application Ser. No. 12/825,410 filed on Jun. 29, 2010 and issued as U.S. Pat. No. 8,283,658 on Oct. 9, 2012, which claims priority of Korean Patent Application No. 10-2009-0060560 filed on Jul. 3, 2009. The disclosure of each of the foregoing applications is incorporated herein by reference in its entirety.

BACKGROUND OF THE INVENTION

Exemplary embodiments of the present invention relate to a technology of semiconductor device fabrication, and more particularly, to a semiconductor device and a method for fabricating the same, by which a leakage current in a junction region may be reduced.

As a degree of integration of a semiconductor device increases, a channel length of a transistor decreases. Also, as the channel length of a transistor decreases, operation characteristics of the semiconductor device may be degraded.

FIG. 1 is a cross-sectional view illustrating a transistor of a conventional semiconductor device.

Describing a conventional transistor with reference to FIG. 1, a gate 17 is formed to have a structure in which a gate dielectric layer 14, a gate electrode 15 and a gate hard mask layer 16 are stacked over a substrate 11. Junction regions 12 are formed in the substrate 11 on both sides of the gate 17. Here, a region where a source or a drain of MOSFET formed is referred to as the junction region. In general, since the junction regions 12 are formed through ion implantation process after forming the gate 17, the gate 17 may overlap with portions of the junction regions 12.

In the transistor having the above-described construction, the junction regions 12 and the substrate 11 have different conductivity types. For example, in a case of an NMOS transistor, the junction regions 12 and the substrate 11 respectively have N-type conductivity and P-type conductivity, and an impurity doping concentration of the junction regions 12 is greater than that of the substrate 11. Consequently, a PN junction may be formed between the substrate 11 and the junction regions 12. Moreover, a depletion region 18 may be formed between the substrate 11 and the junction regions 12 by the PN junction.

However, as a channel length of the transistor decreases due to increase in a degree of integration of a semiconductor device, a leakage current may occur between the junction regions 12 and between the substrate 11 and the junction regions 12 due to an internal electric field of the depletion region 18 formed between the substrate 11 and the junction regions 12 even when an operating voltage is not applied to the gate 17. The leakage current due to the internal electric field of the depletion region 18 may increase as the impurity doping concentration of the junction regions 12 increases and the channel length of the transistor decreases.

SUMMARY OF THE INVENTION

An embodiment of the present invention is directed to a semiconductor device and a method for fabricating the same, which may reduce the occurrence of leakage current between junction regions (that is, a junction region between a channel region), and between a substrate and the junction regions.

In accordance with an embodiment of the present invention, a semiconductor device includes: a plurality of recess patterns formed in junction region to be formed in a substrate; a conductive layer formed in the junction region; and a boundary layer arranged to wrap a side and a bottom of the conductive layer.

In accordance with another embodiment of the present invention, semiconductor device includes a conductive layer formed in a junction region, a boundary layer formed between the conductive layer and a channel region, and a gate formed on the channel region and a portion of the boundary layer.

In accordance with another embodiment of the present invention, a method for fabricating a semiconductor device includes: forming a recess pattern by etching a substrate; forming a boundary layer over a surface of a resultant structure including the recess pattern; forming a conductive layer over the boundary layer to fill a remaining portion of the recess patterns; performing a planarization process to expose an upper surface of the substrate; and forming a gate over the substrate.

DESCRIPTION OF SPECIFIC EMBODIMENTS

Figure 1:
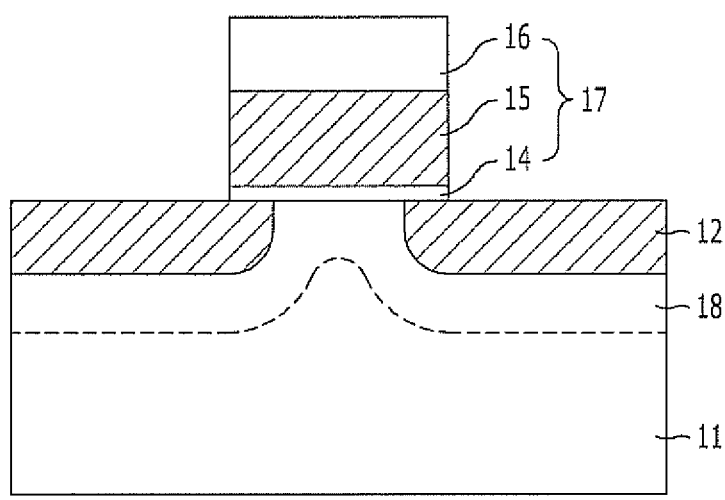
FIG. 1 is a cross-sectional view illustrating a transistor of a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the present invention which will be described below provide a semiconductor device and a method for fabricating the same which may reduce a probability of an occurrence of leakage current between junction regions and between a substrate and the junction regions. The embodiments of the present invention provide a semiconductor device and a method for fabricating the same which includes a boundary layer (for example an organic semiconductor layer).

Figure 2:
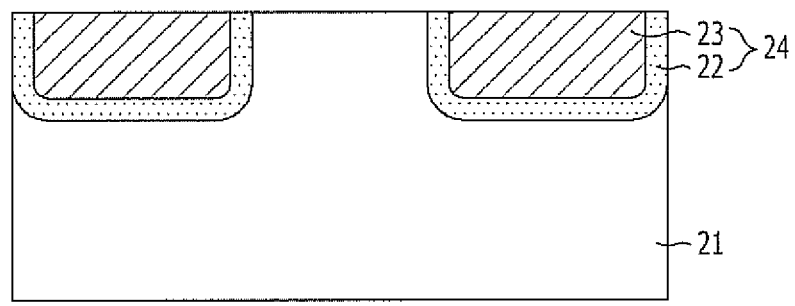
FIG. 2 is a view illustrating a junction region of a semiconductor device in accordance with an embodiment of the present invention.

FIG. 2 is a view illustrating a junction region of a transistor (for example, a junction region of a MOSFET) in accordance with an embodiment of the present invention.

Referring to FIG. 2, a junction region 24 in accordance with the embodiment of the present invention may include a conductive layer 23 and a boundary layer 22 formed wrapping a side and a bottom of the conductive layer.

Here, the substrate 21 may include a silicon substrate as an inorganic semiconductor, also may be formed to have a conductivity type different from (or complementary to) the junction regions 24. For example, a P-type silicon substrate may be used as the substrate 21 in the case of an NMOS transistor and an N-type silicon substrate may be used as the substrate 21 in the case of a PMOS transistor.

The boundary layer 22 may include an organic semiconductor layer. The boundary layer 22 may be formed depending on conductive properties of the semiconductor device, that is, the boundary layer 22 may be formed as an N-type organic semiconductor layer in the case of an NMOS transistor, and may be formed as a P-type organic semiconductor layer in the case of a PMOS transistor. A perylene diimide derivative may be used as the N-type organic semiconductor layer, and pentacene, phthalocyanine, and so forth may be used as the P-type organic semiconductor layer.

Figure 3A:
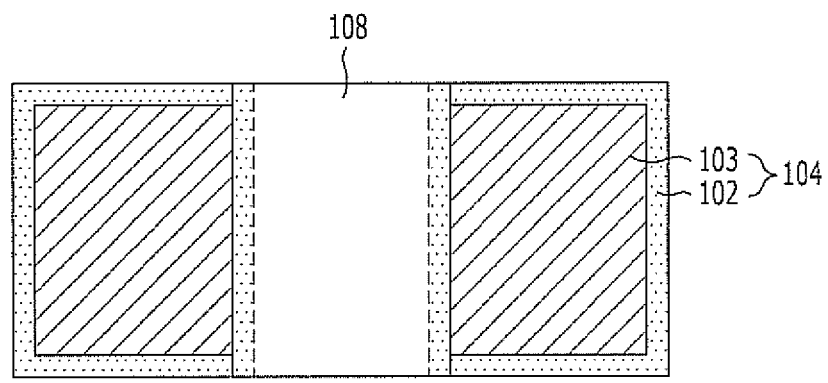
FIGS. 3A and 3B are views illustrating a transistor of a semiconductor device in accordance with another embodiment of the present invention.
Figure 3B:
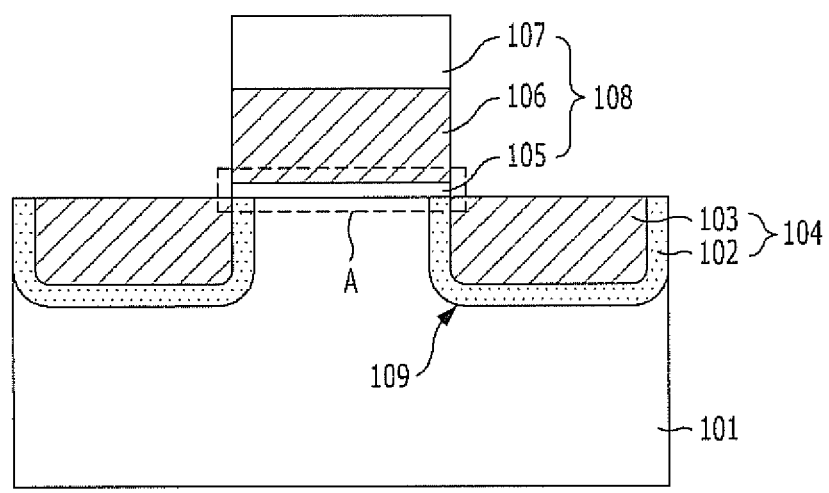

FIGS. 3A and 3B are views illustrating a transistor of a semiconductor device in accordance with another embodiment of the present invention, wherein FIG. 3A is a plan view and FIG. 3B is a cross-sectional view.

Referring to FIGS. 3A and 3B, a transistor in accordance with the embodiment of the present invention may include a plurality of recess patterns 109, junction regions 104, and a gate 108. The plurality of recess patterns 109 may be formed in the junction region to be formed in a substrate 101. The junction regions 104 may include a boundary layer 102 formed over the surfaces of the recess patterns 109 and a conductive layer 103 filling the remaining recess patterns 109 over the boundary layer 102. The gate 108 may be formed over the substrate 101 to cover an upper surface of the boundary layer 102. The gate 108 may include a stack structure in which a gate dielectric layer 105, a gate electrode 106 and a gate hard mask layer 107 are sequentially stacked.

The substrate 101 may include a silicon substrate which is an inorganic semiconductor, and the substrate 101 may be formed to have a conductivity type different from (or complementary to) the junction regions 104 depending upon the conductive properties of the semiconductor device. For example, a P-type silicon substrate may be used as the substrate 101 in the case of an NMOS transistor and an N-type silicon substrate may be used as the substrate 101 in the case of a PMOS transistor.

The conductive layer 103 constituting the junction regions 104 may be formed as a metallic layer or an inorganic semiconductor layer. Tungsten (W), titanium (Ti), ruthenium (Ru), gold (Au), and so forth may be used as the metallic layer. A silicon layer (for example, a polysilicon layer) may be used as the inorganic semiconductor layer.

In the case where the conductive layer 103 is formed as the inorganic semiconductor layer (for example, the polysilicon layer), the conductive layer 103 may be formed to have the same conductivity type as the boundary layer 102. Accordingly, the conductive layer 103 may be formed depending upon the conductive properties of the semiconductor device (that is, as an N-type polysilicon layer in the case of an NMOS transistor and a P-type polysilicon layer in the case of a PMOS transistor).

The boundary layer 102 constituting the junction regions 104 may be formed of a material which has insulation properties when an operating voltage is not applied to the gate 108, and which has conductive properties when an operating voltage is applied to the gate 108. For example, the boundary layer 102 may be formed of an organic semiconductor.

The boundary layer 102 may be formed in conformity with the conductive properties of the semiconductor device (that is, the boundary layer 102 may be formed as an N-type organic semiconductor layer in the case of an NMOS transistor and may be formed a P-type organic semiconductor layer in the case of a PMOS transistor). A perylene diimide derivative may be used as the N-type organic semiconductor layer, and pentacene, phthalocyanine, and so forth may be used as the P-type organic semiconductor layer.

In general, the conductivity type of an organic semiconductor, i.e. whether the conductivity type of an organic semiconductor is a P-type or an N-type, may be determined depending upon properties of the organic semiconductor such as a structure of molecules. Accordingly, if the boundary layer 102 which is formed of the organic semiconductor and the substrate 101 have different conductivity types, then a depletion region by the PN junction may not be formed at the interfaces between the junction regions 104 and the substrate 101 even if a PN junction is formed between the junction regions 104 and the substrate 101. Even through a depletion region is formed between the junction regions 104 and the substrate 101 in this case, because the organic semiconductor layer may not contain impurities for changing a conductivity type, the formation of the depletion region may be negligible in terms of the properties of the semiconductor device.

Therefore, a probability of the occurrence of leakage current between the junction regions 104, and between the substrate 101 and the junction regions 104 may be reduced while an operating voltage is not applied to the gate 108 of the transistor, that is, while the transistor in an "off" state. Furthermore, since the boundary layer 102 formed of the organic semiconductor has insulation properties while an external energy (for example, a voltage or an electric field) is not applied from an outside, the boundary layer 102 may electrically insulate between the conductive layer 103 and the substrate 101 when the operating voltage is not applied to the gate 108, and thus occurrence of leakage current from the junction regions 104 may be reduced.

Conversely, as indicated by the reference symbol 'A' in FIG. 3B, while the operating voltage is applied to the gate 108 of the transistor, that is, while the transistor is in an "on" state, an inversion layer may be formed in the substrate 101 under the gate 108, and at the same time, a conductive path may be formed in the boundary layer 102 where the boundary layer overlaps with the gate 108, because the organic semiconductor layer may have conductive properties while the external energy (for example, an electric field) is applied, as described above.

Since the conductive path of the boundary layer 102 is formed, for example, only in areas overlapping with the gate 108, the boundary layer 102 in the other areas not overlapping with the gate 108 still may have the insulation properties. Due to this fact, the occurrence of leakage current between the substrate 101 and the junction regions 104 may be reduced even when the transistor operates.

As a consequence, in the embodiment of the present invention, the boundary layer 102 formed of the organic semiconductor may reduce a probability of the occurrence of leakage current between the junction regions 104 and between the substrate 101 and the junction regions 104.

Figure 4A:
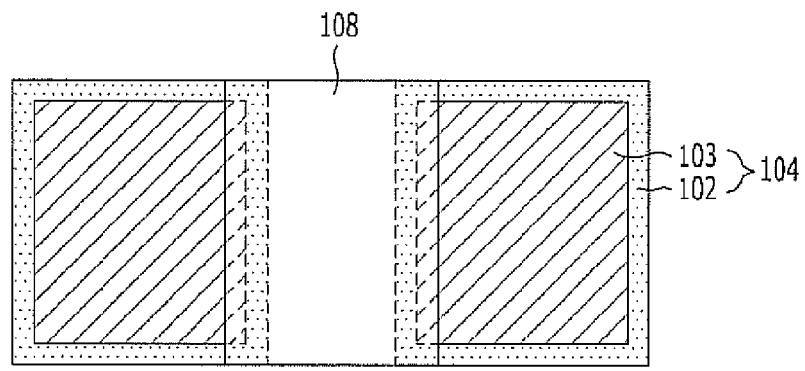
FIGS. 4A and 4B are views illustrating a transistor of a semiconductor device in accordance with another embodiment of the present invention.
Figure 4B:
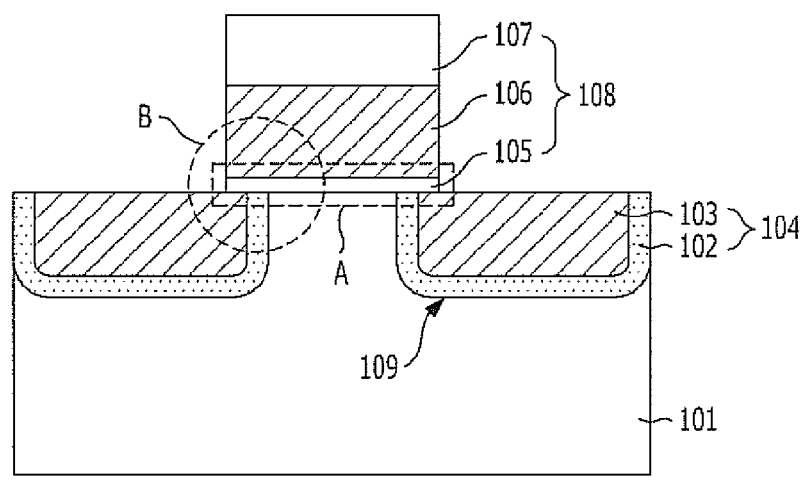

FIGS. 4A and 4B are views illustrating a transistor of a semiconductor device in accordance with another embodiment of the present invention, here, FIG. 4A is a plan view and FIG. 4B is a cross-sectional view. For the sake of convenience in explanation, the same reference numerals will be used to refer to the same component elements as those of the aforementioned embodiment, and differences from the aforementioned embodiment will be mainly described below.

Referring to FIGS. 4A and 4B, a transistor in accordance with another embodiment of the present invention may include a plurality of recess patterns 109 which are formed in junction region to be formed in a substrate 101. The junction regions 104 may include a boundary layer 102 formed over surfaces of the recess patterns 109 and a conductive layer 103 filling the remaining recess patterns 109 over the boundary layer 102. The gate 108 may be formed overlapping with portions of the boundary layer 108 and portions of the conductive layer 103 over the substrate 101. The gate 108 may include a stack structure in which a gate dielectric layer 105, a gate insulation layer 106 and a gate hard mask layer 107 are sequentially stacked.

In the transistor of a semiconductor device in accordance with the another embodiment of the present invention, due to the fact that the gate 108 is structured in such a way as to overlap with the portions of the boundary layer 102 and the portions of the conductive layer 103 of the junction regions 104, a probability of an occurrence of leakage current between the junction regions 104 and between the substrate 101 and the junction regions 104 may be reduced.

In detail, as indicated by the reference symbol 'A' in FIG. 4B, while an operating voltage is applied to the gate 108 of the transistor, that is, while the transistor is in an "on" state, an inversion layer may be formed in the substrate 101 under the gate 108, and at the same time, a conductive path may be formed in the boundary layer 102 where the boundary layer overlaps with the gate 108. At this time, as indicated by the reference symbol 'B' in FIG. 4B, on a side of the boundary layer 102, the carriers concentrated on the surface of the conductive layer 103 where the surface of the conductive layer 103 overlaps with the gate 108 by the operating voltage applied to the gate 108 serve as a kind of electrode, and on the other side of the boundary layer 102, the inversion layer formed in the substrate 101 under the gate 108 serves as another electrode by the operating voltage applied to the gate 108. Therefore, due to a potential difference between both electrodes, carrier mobility in the boundary layer 102 may be improved.

Figure 5A:
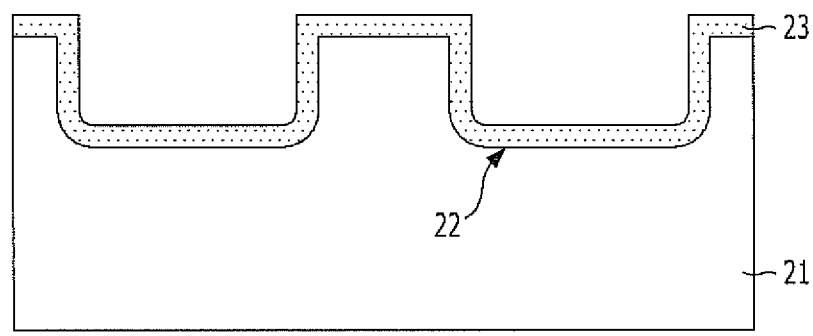
FIGS. 5A through 5C are cross-sectional views illustrating the processes of a method for fabricating a transistor of a semiconductor device in accordance with another embodiment of the present invention.
Figure 5B:
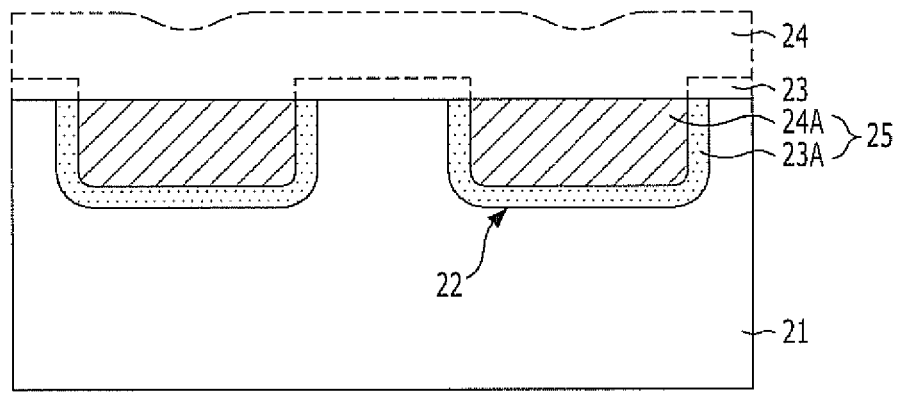
Figure 5C:
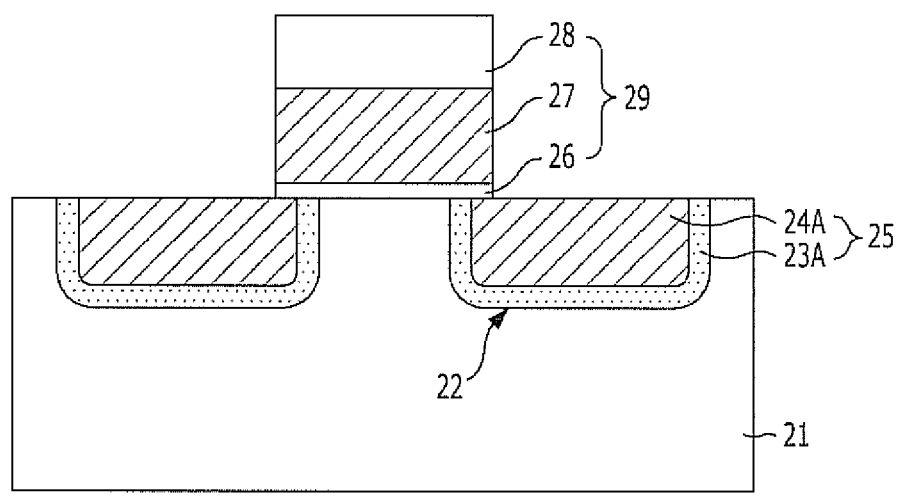

FIGS. 5A through 5C are cross-sectional views illustrating the processes of a method for fabricating a transistor of a semiconductor device in accordance with another embodiment of the present invention.

Referring to FIG. 5A, after forming, over a substrate 21, a photoresist pattern (not shown) which exposes junction region to be formed, recess patterns 22 may be formed by etching the substrate 21 using the photoresist pattern as an etch barrier. The recess patterns 22 define spaces in which junction regions are to be formed through a subsequent process.

An inorganic semiconductor such as a silicon may be used as the substrate 21. Here, the silicon substrate having a conductivity type different from (or complementary to) the junction regions to be formed through the subsequent process may be used. For example, a P-type silicon substrate may be used as the substrate 21 in the case of an NMOS transistor, and an N-type silicon substrate may be used as the substrate 21 in the case of a PMOS transistor.

A boundary layer 23 may be formed over the surface of a resultant structure including the recess patterns 22. The boundary layer 23 may be formed of a material which has insulation properties while external energy (for example, a voltage or an electric field) is not applied, and conductive properties while the external energy is applied. Therefore, the boundary layer 23 may be formed of an organic semiconductor.

The boundary layer 23 may be formed depending upon the conductive properties of the semiconductor device, that is, the boundary layer 23 may be formed of an N-type organic semiconductor layer in the case of an NMOS transistor and a P-type organic semiconductor layer in the case of a PMOS transistor. A perylene diimide derivative may be used as the N-type organic semiconductor layer, and pentacene, phthalocyanine, and so forth may be used as the P-type organic semiconductor layer.

Referring to FIG. 5B, a conductive layer 24 is formed over the boundary layer 23 to fill the remaining portions of the recess patterns 22. The conductive layer 24 may serve as actual junction regions and may be formed of a metallic material or an inorganic semiconductor.

In detail, in the case where the conductive layer 24 is formed of the metallic layer, tungsten (W), titanium (Ti), ruthenium (Ru), gold (Au), and so forth may be used to form the metallic layer. The gold (AU) which has good interfacial properties with respect to the boundary layer 23 including the organic semiconductor layer may be used as the conductive layer 24.

Also, the conductive layer 24 may be formed of the inorganic semiconductor (for example, a silicon layer such as a polysilicon layer). Here, the conductive layer 24 formed of the inorganic semiconductor layer such as the polysilicon layer may be formed to have the same conductivity type as the boundary layer 21 Accordingly, the conductive layer 24 may be formed of an N-type polysilicon in the case of an NMOS transistor and a P-type polysilicon in the case of a PMOS transistor.

A planarization process may be conducted such that the upper surface of the substrate 21 is exposed. The planarization process may be conducted through CMP (chemical mechanical polishing). From this point on, the planarized boundary layer 23 and conductive layer 24 are respectively designated by reference numerals 23A and 24A.

Through the above-described procedure, junction regions 25 filled in the recess patterns 22 and having a structure in which the boundary layer 23A and the conductive layer 24A are stacked may be formed.

Referring to FIG. 5C, a gate 29 may be formed over the substrate 21 in such a way as to overlap with portions of the junction regions 25. The gate 29 may be formed to have a stack structure in which a gate dielectric layer 26, a gate electrode 27 and a gate hard mask layer 28 are sequentially stacked.

The gate 29 partially overlapping with the junction regions 25 may be formed to overlap with portions of at least the boundary layer 23A (see FIGS. 3A and 3B). Also, the gate 29 may be formed to overlap with portions of the boundary layer 23A and portions of the conductive layer 24A (see FIGS. 4A and 4B). The reason why the gate 29 is formed to overlap with portions of at least the boundary layer 23A resides in that a conductive path may be formed in the boundary layer 23A under the gate 29 while the operating voltage is applied to the gate 29. Thus, the normal operation of a transistor may be performed.

As is apparent from the above description, in the embodiments of the present invention, since a boundary layer is formed, a probability of the occurrence of leakage current between junction regions and between a substrate and the junction regions may be reduced.

While the present invention has been described with respect to the specific embodiments, it will be apparent to those skilled in the art that various changes and modifications may be made without departing from the spirit and scope of the invention as defined in the following claims.

The invention claimed is:

1. A method for fabricating a semiconductor device, comprising:
   forming a recess pattern by etching a substrate;
   forming a boundary layer over a surface of a resultant structure including the recess pattern, wherein the boundary layer comprises an organic semiconductor;
   forming a conductive layer over the boundary layer to fill a remaining portion of the recess pattern;
   performing a planarization process to expose an upper surface of the substrate; and
   forming a gate over the substrate.

2. The method of claim 1, wherein the gate is formed to cover an upper surface of the boundary layer.

3. The method of claim 1, wherein the gate is formed to cover an upper surface of the boundary layer and a portion of the conductive layer.

4. The method of claim 1, wherein the boundary layer and the conductive layer are formed to have the same conductivity type.

5. The method of claim 1, wherein the organic semiconductor comprises a perylene diimide derivative having an N-conductivity type.

6. The method of claim 1, wherein the organic semiconductor comprises pentacene or phthalocyanine having a P-conductivity type.

7. The method of claim 1, wherein the conductive layer comprises an inorganic semiconductor.

8. The method of claim 7, wherein the inorganic semiconductor comprises a polysilicon.

9. The method of claim 1, wherein the conductive layer comprises a metallic layer.

10. The method of claim 9, wherein the metallic layer comprises gold (Au).

* * * * *